United States Patent [19]
Hanna

[11] Patent Number: 5,119,041
[45] Date of Patent: Jun. 2, 1992

[54] HIGH GAIN DIFFERENTIAL CURRENT AMPLIFIER HAVING A LOW OUTPUT VOLTAGE

[75] Inventor: John E. Hanna, Mesa, Ariz.
[73] Assignee: Motorola, Inc., Schaumburg, Ill.
[21] Appl. No.: 737,281
[22] Filed: Jul. 29, 1991
[51] Int. Cl.$^5$ .............................................. H03F 3/45
[52] U.S. Cl. .................................... 330/252; 330/258
[58] Field of Search ............... 330/252, 258, 259, 261, 330/290, 296, 310

[56] References Cited
U.S. PATENT DOCUMENTS

| 4,272,728 | 6/1981 | Wittlinger | 330/258 X |
| 4,996,498 | 2/1991 | Hanna | 330/258 |

Primary Examiner—Steven Mottola
Attorney, Agent, or Firm—Robert D. Atkins

[57] ABSTRACT

A current amplifier provides high gain and low output voltage. Differential input currents of the current amplifier are sunk by first and second transistors through a first resistor network. Any common mode variation in the input currents is detected by first and second emitter-follower transistors which control the bases of the first and second transistors, respectively, through a resistor divider network such that the first and second transistors conduct the common mode variation in the input currents and maintain the average value of the output voltages of the emitter-follower transistors substantially constant. An output differential amplifier is also responsive to the voltage difference between the emitter-follower transistors and the center tap of the resistor divider for providing constant output currents. The emitters of the output differential transistors return to ground through a second resistor network which enables the output voltage of the current amplifier to operate at a low value.

17 Claims, 2 Drawing Sheets

HIGH GAIN DIFFERENTIAL CURRENT AMPLIFIER HAVING A LOW OUTPUT VOLTAGE

BACKGROUND OF THE INVENTION

This invention relates in general to current amplifiers and, more specifically, to a high gain differential current amplifier having a low output voltage.

Current amplifiers are found in a myriad of applications in electronic circuit design for amplifying an input current to provide an output current having increased amplitude. Some desirable features of the current amplifier are high gain for providing the large output current and minimal output voltage for operation with external circuitry requiring a low input voltage overhead. The combination of a high gain, say 10 dB, and a low output voltage of less than one volt have proven to be difficult features to achieve simultaneously in the prior art.

A prior art current amplifier is discussed in the Detailed Description of the Prior Art section. One principal drawback with the prior art example is the excessive output voltage which may be unacceptably high for many external circuits requiring a low input voltage overhead.

Hence, what is needed is an improved current amplifier having a high gain and a low output voltage.

SUMMARY OF THE INVENTION

Briefly stated, the invention comprises a current amplifier circuit responsive to first and second input currents for providing first and second output currents including first and second transistors each having a collector coupled for receiving the first and second input currents and developing first and second voltages respectively. The bases of the first and second transistors are coupled together at a first node for receiving a reference potential. A first resistive circuit is coupled between the emitters of the first and second transistors and a first power supply conductor. A first circuit includes first and second inputs coupled to the collectors of the first and second transistors respectively for buffering the first and second voltages at first and second outputs, while a second circuit is coupled between the first and second outputs of the first circuit for averaging the buffered first and second voltages to provide the reference potential having a substantially constant value at the first node. The base of a third transistor is coupled to the first output of the first circuit, and the base of a fourth transistor is coupled to the second output of the first circuit. The collectors of the third and fourth transistors provide the first and second output currents of the amplifier circuit respectively. A second resistive circuit is coupled between the emitters of the third and fourth transistors and the first power supply conductor.

In another aspect, the present invention is a method of amplifying first and second input currents for providing first and second output currents comprising the steps of sinking the first and second input currents in response to a first reference potential and developing first and second voltages dependent upon the first and second input currents, buffering the first and second voltages, averaging the buffered first and second voltages to provide the first reference potential having a substantially constant value, and level shifting the first reference potential by a predetermined magnitude for providing a second reference potential. The first output current flows in response to a first potential difference between the buffered first output voltage and the second reference potential, while the second output current flows in response to a second potential difference between the buffered second output voltage and the second reference potential.

DETAILED DESCRIPTION OF THE PRIOR ART

Figure 1:
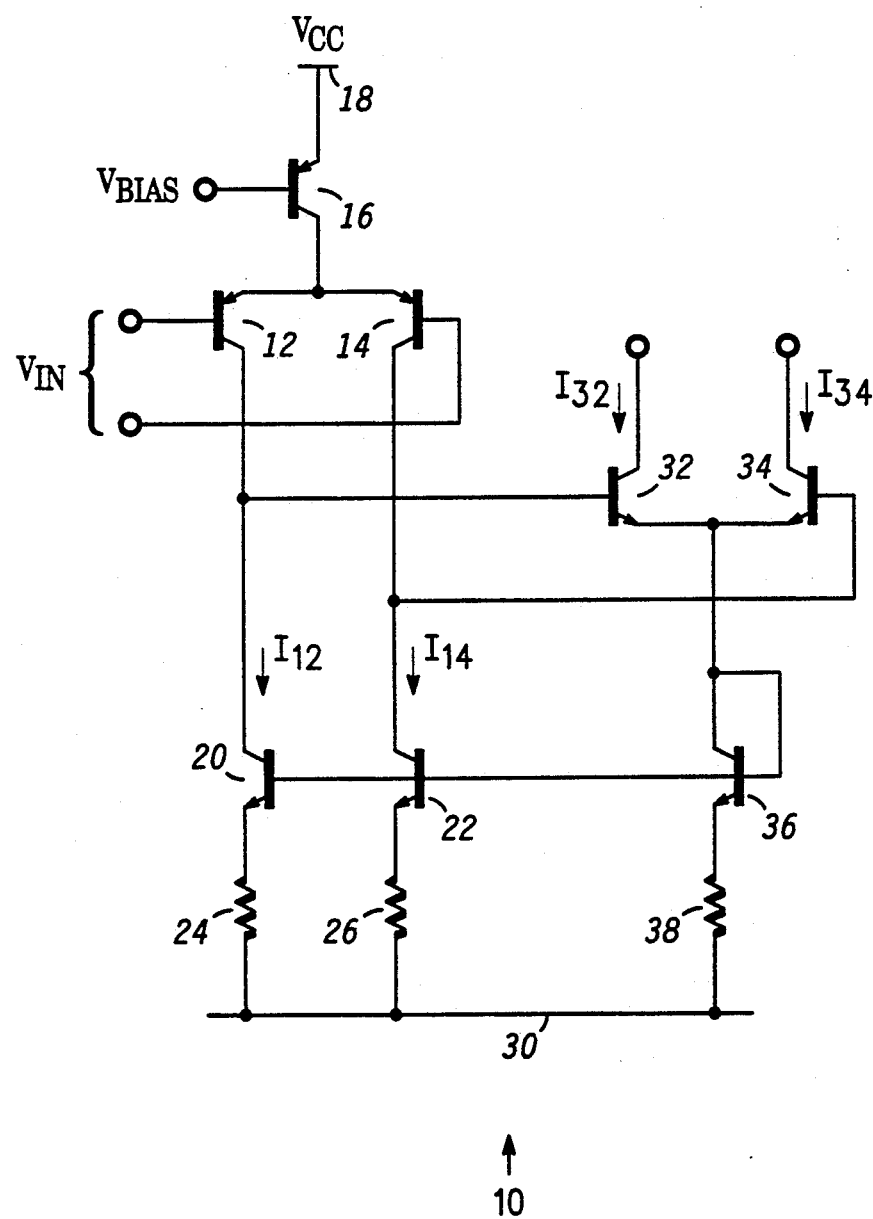
FIG. 1 is a schematic diagram of a conventional current amplifier.

A conventional current amplifier 10 is shown in FIG. 1 as prior art including emitter-coupled transistors 12 and 14 each having a base coupled for receiving the differential input signal $V_{IN}$. The emitters of transistors 12 and 14 are coupled through transistor 16 to power supply conductor 18 operating at a positive potential such as $V_{CC}$. The base of transistor 16 receives bias potential $V_{BIAS}$ allowing it to operate as a current source. The collectors of transistors 12 and 14 source currents $I_{12}$ and $I_{14}$ through the collector-emitter conduction paths of transistors 20 and 22 and resistors 24 and 26, respectively, to power supply conductor 30 operating at ground potential.

The output amplifier of the circuit includes transistors 32 and 34 for conducting currents $I_{32}$ and $I_{34}$. The bases of transistors 32 and 34 are coupled to the collectors of transistors 12 and 14, respectively. Transistor 36 is configured as a diode with its collector and base coupled to the common emitters of transistors 32 and 34 and to the common bases of transistors 20 and 22. The emitter of transistor 36 is coupled through degeneration resistor 38 to power supply conductor 30. The differential input signal $V_{IN}$ is converted to differential currents $I_{12}$ and $I_{14}$ for providing base drive to transistors 32 and 34 and thereby generate gain for currents $I_{32}$ and $I_{34}$ through the forward current gains of transistors 32 and 34.

The minimum voltages allowable at the collectors of transistors 32 and 34 are equal to the base-emitter junction potentials of transistors 32 and 34, respectively, plus the base-emitter junction potential ($V_{be}$) of transistor 36 plus the voltage developed across degeneration resistor 38 by the sum of currents $I_{32}$ and $I_{34}$. Although the prior art has achieved moderate current gain through amplifier 10, the use of transistor 36 to improve output current control over temperature and process variation has increased the output voltage required at the collectors of transistors 32 and 34 by at least the $V_{be}$ of transistor 36. Therefore, it is desirable to eliminate transistor 36 to reduce output voltage while maintaining a high current gain.

DETAILED DESCRIPTION OF THE PREFERRED EMBODIMENT

Figure 2:
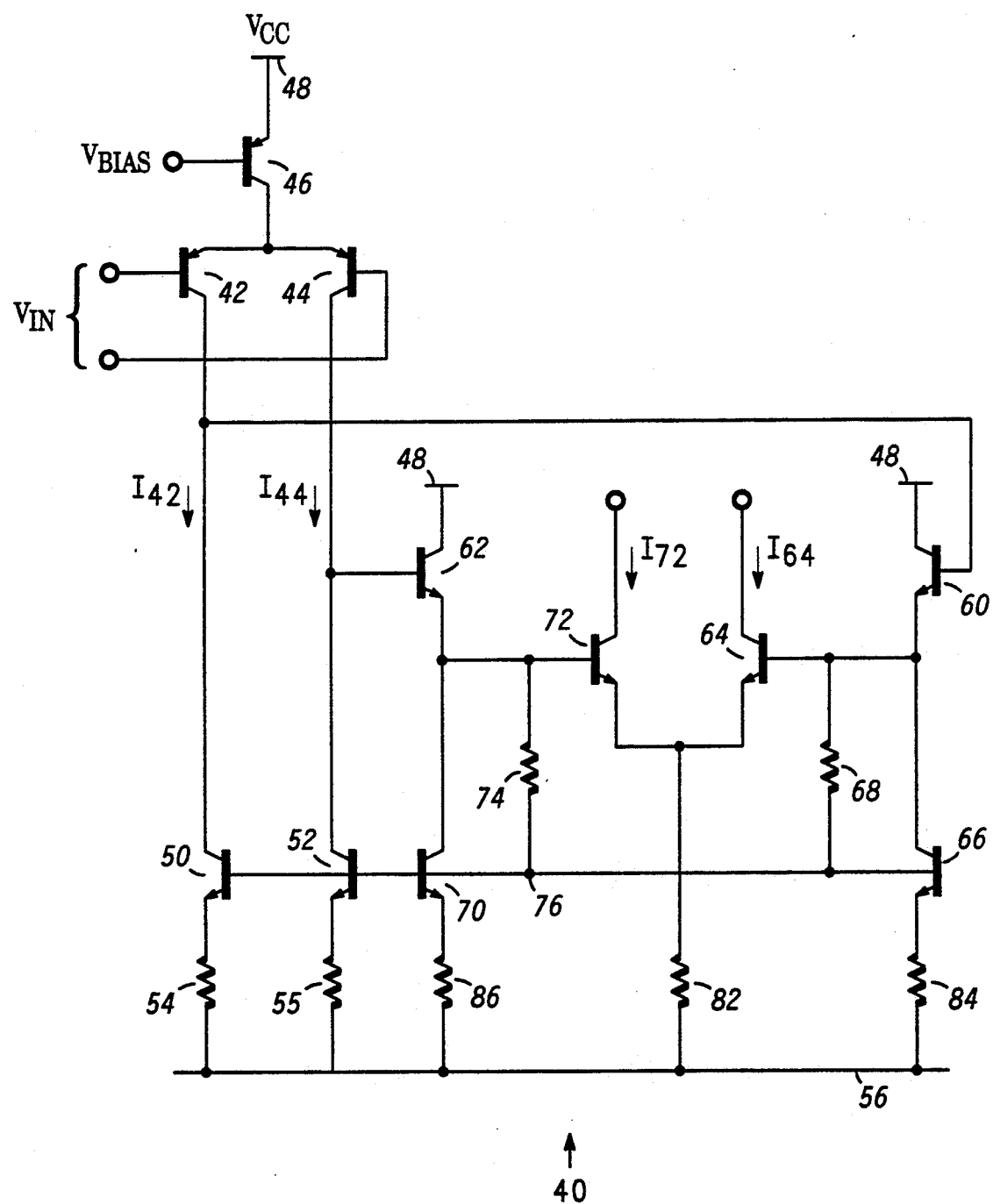
FIG. 2 is a schematic diagram illustrating an improved current amplifier.

Referring to FIG. 2, current amplifier 40 is shown with emitter-coupled transistors 42 and 44 each having a base coupled for receiving the differential input signal $V_{IN}$. Transistor 46 operates as a current source with a base coupled for receiving bias potential $V_{BIAS}$, an emitter coupled to power supply conductor 48 typically operating at a positive potential such as $V_{CC}$, and a collector coupled to the common emitters of transistors 42 and 44. The collectors of transistors 42 and 44 conduct currents $I_{42}$ and $I_{44}$, respectively, through the collector-emitter conduction paths of transistors 50 and 52.

The emitters of transistors 50 and 52 are coupled through resistors 54 and 55, respectively, to power supply conductor 56 operating at ground potential.

The collectors of transistors 42 and 44 are also coupled to the bases of transistors 60 and 62 operating as emitter-follower buffers for providing high impedance at the collectors of transistors 42 and 44. Transistor 60 includes a collector coupled to power supply conductor 48 and an emitter coupled to the base of transistor 64, to the collector of transistor 66, and through resistor 68 to the base of transistor 66.

Likewise, transistor 62 includes a collector coupled to power supply conductor 48 and an emitter coupled to the collector of transistor 70, to the base of transistor 72, and through resistor 74 to the common bases of transistors 50, 52, 66 and 70 at node 76. Resistors 68 and 74 may be selected at 10K ohms each. The emitters of transistors 64 and 72 are coupled through resistor 82 to power supply conductor 56, and the emitters of transistors 66 and 70 are coupled through resistors 84 and 86, respectively, to power supply conductor 56. Transistors 66 and 70 operate as current sink devices for setting and conducting the emitter currents of transistors 60 and 62. The collectors of transistors 64 and 72 conduct output currents $I_{64}$ and $I_{72}$ amplified with respect to input currents $I_{42}$ and $I_{44}$.

The operation of current amplifier 40 proceeds as follows. Transistors 42 and 44 conduct differential currents $I_{42}$ and $I_{44}$, respectively, in response to the differential input voltage $V_{IN}$. The differential current $I_{42}$ and $I_{44}$ control the voltage at the bases of transistors 60 and 62 which provide gain through their emitter-follower configuration, and the emitter-coupled transistor pair 64 and 72, to conduct output currents $I_{64}$ and $I_{72}$, respectively.

Due to the emitter-follower configuration of transistors 60 and 62, the potentials at the bases of transistors 64 and 72 operate in a balanced differential manner such that the voltage developed at node 76 remains substantially constant. For example, as the potential at the base of transistor 64 increases, the potential at the base of transistor 72 decreases by a similar magnitude whereby resistors 68 and 74 balance the offset and maintain node 76 at a constant potential. Resistors 68 and 74 may be viewed as a resistor divider network coupled between the bases of transistors 64 and 72 with a center tap at node 76 maintaining a constant potential. The voltage at node 76 controls transistors 50 and 52 to conduct substantially all of currents $I_{42}$ and $I_{44}$, respectively.

Transistors 60 and 62 and resistors 68 and 74 establish a common mode feedback loop through transistors 50 and 52 to compensate for variation in the input voltage $V_{IN}$. For example, if the single-ended voltages applied at the bases of transistors 42 and 44 fall together in a common mode manner, transistors 42 and 44 sink more current $\Delta I$ causing the voltage at the collectors of transistors 50 and 52 to increase. The voltages developed at the bases of transistors 64 and 72 increase accordingly through emitter-follower transistors 60 and 52, thus starting a positive level shift at node 76 which increases the conduction through transistors 50 and 52 to sink the $\Delta I$ currents and return the collectors of transistors 42 and 44 to their nominal value. The aforedescribed chain of events is dynamic such that the voltage at node 76 maintains a constant value.

The average value of the voltages at the bases of transistors 64 and 72 is equal to the value of the voltage at node 76. Therefore, the potential at the emitters of transistors 64 and 72 is equal to the emitter potential of transistors 50 and 52 with a value level shifted one $V_{be}$ below node 76. Furthermore, the average value of the voltages developed at the collectors of transistors 42 and 44 remain substantially constant. Since the emitter potential of transistors 50 and 52 is well controlled and constant by degeneration resistor 54 and the common mode feedback loop of transistor 60 and 62 and resistors 68 and 74, then the emitter potentials of transistors 64 and 72 are also substantially constant. With stable $V_{be}$'s across transistors 64 and 72, output currents $I_{64}$ and $I_{72}$ are constant.

By maintaining a fixed reference potential at node 76, a transistor like 36 from FIG. 1 is no longer needed allowing transistors 50, 52 and transistors 64, 72 to operate with just regeneration resistors 54 and 82, respectively. The voltage at the emitters of transistors 50-52 (and transistors 64 and 72) may be set to a convenient value, say 200 millivolts, allowing the collectors of transistors 64 and 72 operate at less than one volt for current amplifier applications requiring low output voltage.

In contrast with the prior art of FIG. 1 where the potential at the emitters of transistors 36 and 38 is the $V_{be}$ of transistor 36 (700 millivolts) plus the potential developed across degeneration resistor 38, the potential at the emitters of transistors 64 and 72 is simply the voltage developed across degeneration resistor 82. Thus, the present invention can reduce the output voltage of the current amplifier by at least one $V_{be}$ over the noted prior art.

Hence, what has been provided is a high gain current amplifier providing substantially constant differential output currents with a low output voltage.

I claim:

1. A current amplifier circuit responsive to first and second input currents for providing first and second output currents, comprising:

first and second transistors each having a collector, a base and an emitter, said collectors being coupled for receiving the first and second input currents and developing first and second voltages respectively, said bases being coupled together at a first node for receiving a reference potential;

first resistive means coupled between said emitters of said first and second transistors and a first power supply conductor;

first means having first and second inputs coupled to said collectors of said first and second transistors respectively for buffering said first and second voltages at first and second outputs;

second means coupled between said first and second outputs of said first means for averaging said buffered first and second voltages to provide said reference potential having a substantially constant value at said first node;

third and fourth transistors each having a collector, a base and an emitter, said base of said third transistor being coupled to said first output of said first means, said base of said fourth transistor being coupled to said second output of said first means, said collectors of said third and fourth transistors conducting the first and second output currents of the amplifier circuit respectively; and second resistive means coupled between said emitters of said third and fourth transistors and said first power supply conductor.

2. The current amplifier circuit of claim 1 wherein said first means includes:
- a fifth transistor having a collector, a base and an emitter, said collector being coupled to a second power supply conductor, said base being coupled to said collector of said first transistor, said emitter being coupled to said base of said third transistor; and
- a sixth transistor having a collector, a base and an emitter, said collector being coupled to said second power supply conductor, said base being coupled to said collector of said second transistor, said emitter being coupled to said base of said fourth transistor.

3. The current amplifier circuit of claim 2 wherein said second means includes:
- a third resistor coupled between said emitter of said fifth transistor and said first node; and
- a fourth resistor coupled between said emitter of said sixth transistor and said first node.

4. The current amplifier circuit of claim 3 wherein said first means further includes:
- a seventh transistor having a collector, a base and an emitter, said collector being coupled to said emitter of said fifth transistor, said base being coupled to said first node;
- a fifth resistor coupled between said emitter of said seventh transistor and said first power supply conductor;
- an eighth transistor having a collector, a base and an emitter, said collector being coupled to said emitter of said sixth transistor, said base being coupled to said first node; and
- a sixth resistor coupled between said emitter of said eighth transistor and said first power supply conductor.

5. The current amplifier circuit of claim 4 further including:
- a ninth transistor having a collector, a base and an emitter, said collector being coupled to said collector of said first transistor;
- a tenth transistor having a collector, a base and an emitter, said collector being coupled to said collector of said second transistor, said bases of said ninth and tenth being coupled for receiving a differential input voltage for enabling conduction of the first and second input currents through said first and second transistors; and
- an eleventh transistor having a collector, a base and an emitter, said emitter being coupled to said second power supply conductor, said collector being coupled to said emitters of said ninth and tenth transistors, said base being coupled for receiving a bias potential for operating said eleventh transistor as a current source.

6. A current amplifier circuit responsive to first and second input currents for providing first and second output currents, comprising:
- first and second transistors each having a collector, a base and an emitter, said collectors being coupled for receiving the first and second input currents, said bases being coupled together at a first node for receiving a reference potential;
- first resistive means coupled between said emitters of said first and second transistors and a first power supply conductor;
- a third transistor having a collector, a base and an emitter, said collector being coupled to a second power supply conductor, said base being coupled to said collector of said first transistor;
- a fourth transistor having a collector, a base and an emitter, said collector being coupled to said second power supply conductor, said base being coupled to said collector of said second transistor;
- fifth and sixth transistors each having a collector, a base and an emitter, said base of said fifth transistor being coupled to said emitter of said third transistor, said base of said sixth transistor being coupled to said emitter of said fourth transistor, said collectors of said fifth and sixth transistors conducting the first and second output currents of the amplifier circuit respectively;
- second resistive means coupled between said emitters of said fifth and sixth transistors and said first power supply conductor;
- a third resistor coupled between said emitter of said third transistor and said first node; and
- a fourth resistor coupled between said emitter of said fourth transistor and said first node for providing said reference potential.

7. The current amplifier circuit of claim 6 further including:
- a seventh transistor having a collector, a base and an emitter, said collector being coupled to said emitter of said third transistor, said base being coupled to said first node; and
- a fifth resistor coupled between said emitter of said seventh transistor and said first power supply conductor.

8. The current amplifier circuit of claim 7 further including:
- an eighth transistor having a collector, a base and an emitter, said collector being coupled to said emitter of said fourth transistor, said base being coupled to said first node; and
- a sixth resistor coupled between said emitter of said eighth transistor and said first power supply conductor.

9. The current amplifier circuit of claim 8 further including:
- a ninth transistor having a collector, a base and an emitter, said collector being coupled to said collector of said first transistor;
- a tenth transistor having a collector, a base and an emitter, said collector being coupled to said collector of said second transistor, said bases of said ninth and tenth being coupled for receiving a differential input voltage for enabling conduction of the first and second input currents through said first and second transistors; and
- an eleventh transistor having a collector, a base and an emitter, said emitter being coupled to said second power supply conductor, said collector being coupled to said emitters of said ninth and tenth transistors, said base being coupled for receiving a bias potential for operating said eleventh transistor as a current source.

10. A method of amplifying first and second input currents for providing first and second output currents, comprising the steps of:
- sinking the first and second input currents in response to a first reference potential and developing first and second voltages dependent upon the first and second input currents;
- buffering said first and second voltages;

averaging said buffered first and second voltages to provide said first reference potential having a substantially constant value;

level shifting said first reference potential by a predetermined magnitude for providing a second reference potential;

conducting said first output current in response to a first potential difference between said buffered first output voltage and said second reference potential; and conducting the second output current in response to a second potential difference between said buffered second output voltage and said second reference potential.

11. A current amplifier circuit responsive to first and second input currents for providing first and second output currents, comprising:

first means for sinking the first and second input currents in response to a first reference potential and developing first and second voltages at first and second outputs dependent upon the first and second input currents, said first means level shifting said first reference potential for providing a reduced second reference potential;

second means having first and second inputs coupled to said first and second outputs of said first means respectively for buffering said first and second voltages at first and second outputs;

third means coupled between said first and second outputs of said second means for averaging said buffered first and second voltages to provide said first reference potential having a substantially constant value at a first node; and fourth means for conducting said first output current in response to a first potential difference between said buffered first output voltage and a potential substantially equal to said second reference potential, said fourth means conducting the second output current in response to a second potential difference between said buffered second output voltage and said potential substantially equal to said second reference potential.

12. The current amplifier circuit of claim 11 wherein said first means includes:

first and second transistors each having a collector, a base and an emitter, said collectors being coupled for receiving the first and second input currents, said bases being coupled together at said first node, said emitters providing said second reference potential; and first resistive means coupled between said emitters of said first and second transistors and a first power supply conductor.

13. The current amplifier circuit of claim 12 wherein said second means includes:

a third transistor having a collector, a base and an emitter, said collector being coupled to a second power supply conductor, said base being coupled to said collector of said first transistor, said emitter being coupled to said first output of said second means; and a fourth transistor having a collector, a base and an emitter, said collector being coupled to said second power supply conductor, said base being coupled to said collector of said second transistor, said emitter being coupled to said second output of said second means.

14. The current amplifier circuit of claim 13 wherein said fourth means includes:

fifth and sixth transistors each having a collector, a base and an emitter, said base of said fifth transistor being coupled to said emitter of said third transistor, said base of said sixth transistor being coupled to said emitter of said fourth transistor, said collectors of said fifth and sixth transistors conducting the first and second output currents of the amplifier circuit respectively; and second resistive means coupled between said emitters of said fifth and sixth transistors and said first power supply conductor.

15. The current amplifier circuit of claim 14 wherein said third means includes:

a third resistor coupled between said emitter of said third transistor and said first node; and a fourth resistor coupled between said emitter of said fourth transistor and said first node.

16. The current amplifier circuit of claim 15 wherein said second means further includes:

a seventh transistor having a collector, a base and an emitter, said collector being coupled to said emitter of said third transistor, said base being coupled to said first node;

a fifth resistor coupled between said emitter of said seventh transistor and said first power supply conductor;

an eighth transistor having a collector, a base and an emitter, said collector being coupled to said emitter of said fourth transistor, said base being coupled to said first node; and a sixth resistor coupled between said emitter of said eighth transistor and said first power supply conductor.

17. The current amplifier circuit of claim 16 further including:

a ninth transistor having a collector, a base and an emitter, said collector being coupled to said collector of said first transistor;

a tenth transistor having a collector, a base and an emitter, said collector being coupled to said collector of said second transistor, said bases of said ninth and tenth being coupled for receiving a differential input voltage for enabling conduction of the first and second input currents through said first and second transistors; and an eleventh transistor having a collector, a base and an emitter, said emitter being coupled to said second power supply conductor, said collector being coupled to said emitters of said ninth and tenth transistors, said base being coupled for receiving a bias potential for operating said eleventh transistor as a current source.

* * * * *